(12) United States Patent
Pavan et al.

(10) Patent No.: US 6,545,567 B1
(45) Date of Patent: Apr. 8, 2003

(54) PROGRAMMABLE ANALOG TAPPED DELAY LINE FILTER HAVING CASCADED DIFFERENTIAL DELAY CELLS

(75) Inventors: Shanthi Pavan, Fremont, CA (US);
Sudeep Bhoja, San Jose, CA (US);
John S. Wang, Sunnyvale, CA (US)

(73) Assignee: Big Bear Networks, Inc., Milpitas, CA (US)

( * ) Notice: Subject to any disclaimer, the term of this patent is extended or adjusted under 35 U.S.C. 154(b) by 0 days.

(21) Appl. No.: 09/955,563

(22) Filed: Sep. 17, 2001

(51) Int. Cl.[7] ............................................. H03H 15/00
(52) U.S. Cl. ..................... 333/166; 333/193; 333/153; 333/165; 333/16
(58) Field of Search ................................ 333/166, 165, 333/16, 152, 153, 193

(56) References Cited

U.S. PATENT DOCUMENTS

| | | | | |
|---|---|---|---|---|
| 3,758,881 A | * | 9/1973 | Rummler | 333/16 |
| 4,038,536 A | * | 7/1977 | Feintuch | 333/166 |
| 4,612,522 A | * | 9/1986 | Dyck | 333/166 |
| 5,194,837 A | * | 3/1993 | Smythe et al. | 333/166 |

* cited by examiner

*Primary Examiner*—Michael Tokar
*Assistant Examiner*—Lam T. Mai

(57) ABSTRACT

Method and system for a programmable analog tapped delay line filter are disclosed. One embodiment of the present invention is a programmable analog tapped delay line filter comprising an input line, an output line, and one or more gaincells or taps coupled between the input line and the output line. The input and output lines each comprises a cascade of one or more differential delay cells, and each of the one or more gaincells or taps corresponds to a tap weight or coefficient. Furthermore, the input and output lines are terminated in impedances and the filter produces one or more outputs.

18 Claims, 4 Drawing Sheets

PROGRAMMABLE ANALOG TAPPED DELAY LINE FILTER HAVING CASCADED DIFFERENTIAL DELAY CELLS

BACKGROUND INFORMATION

1. Field of Invention

The present invention relates to the field of electronic components, and in particular to a programmable analog tapped delay line filter.

2. Description of Related Art

Adaptive equalizers in communication systems have been used in the transmitter and receiver to compensate channel Inter Symbol Interference (ISI).

In order to compensate for linear ISI in a receiver, an equalizer in the form of a tapped delay line filter may be installed between the receiver preamplifier and threshold detector to shape the pulse at the input of the decision device.

FIG. 1 illustrates a conceptual schematic of a conventional tapped delay line analog filter 100. The filter 100 comprises: an input signal denoted 1; one or more delay cells denoted 3, 5, and 7; four taps 9, 11, 13, and 15, each with a tap coefficient denoted C0, C1, C2, and C3 respectively; and an output signal 17.

As illustrated in FIG. 1, input signal 1 passes through delay cells 3, 5, and 7, whose function is to produce delayed versions of the input signal 1. Moreover, output signal 17 is a weighted sum of the delayed inputs, expressed as:

$$y(t)=C0*x(t)+C1*x(t-T)+C2*x(t-2T)+C3*x(t-3T)+$$

where T represents a constant delay for each delay cell.

In order for the equalizer to be optimally adaptive, the tap coefficients should be variable both in value and in sign, wherein each tap coefficient varies independently of any other tap coefficient. Furthermore, single ended delay cells may be sensitive to factors such as power supply noise, common-mode coupling, and substrate noise.

Although conventionally accepted analog tapped delay line filters operating at microwave frequencies (i.e. several gigahertz and higher) are able to alleviate the problem of equalizing communication channels, these filters have either fixed tap coefficients (e.g. fixed sign, fixed value, etc.) or employ single ended delay cells sensitive to noise errors.

SUMMARY OF THE INVENTION

The present invention provides the method and apparatus for a programmable analog tapped delay line filter.

In one embodiment of the present invention, a programmable analog tapped delay line filter comprises an input line, an output line, and one or more gaincells or taps. The input and output lines each comprises a cascade of one or more differential delay cells. The one or more gaincells are coupled between the input and output lines. Furthermore, the input and output lines are terminated in impedances and the filter produces one or more outputs.

Moreover, the one or more differential delay cells may be implemented with either transmission lines or L-C sections. The one or more gaincells or taps may be differential amplifiers with programmable gain, whose output current is proportional to the input voltage; and the gaincells or taps may be implemented with active devices such as bipolar junction transistors, Metal-Oxide-Semiconductor FETs, Heterojunction devices, etc.

The programmable analog tapped delay filter receives differential values of an input signal at two distinct inputs; delays the difference of the inputs by each of the one or more differential delay cells; and outputs one or more output signals.

BRIEF DESCRIPTION OF THE DRAWINGS

The accompanying drawings that are incorporated in and form a part of this specification illustrate embodiments of the invention and together with the description, serve to explain the principles of the invention.

DETAILED DESCRIPTION

The following description is presented to enable one of ordinary skill in the art to make and use the invention and is provided in the context of a patent application and its requirements. In the following description, specific nomenclature is set forth to provide a thorough understanding of the present invention. It will be apparent to one skilled in the art that the specific details may not be necessary to practice the present invention. Furthermore, various modifications to the embodiments will be readily apparent to those skilled in the art and the generic principles herein may be applied to other embodiments. Thus, the present invention is not intended to be limited to the embodiments shown but is to be accorded the widest scope consistent with the principles and features described herein.

Figure 1:
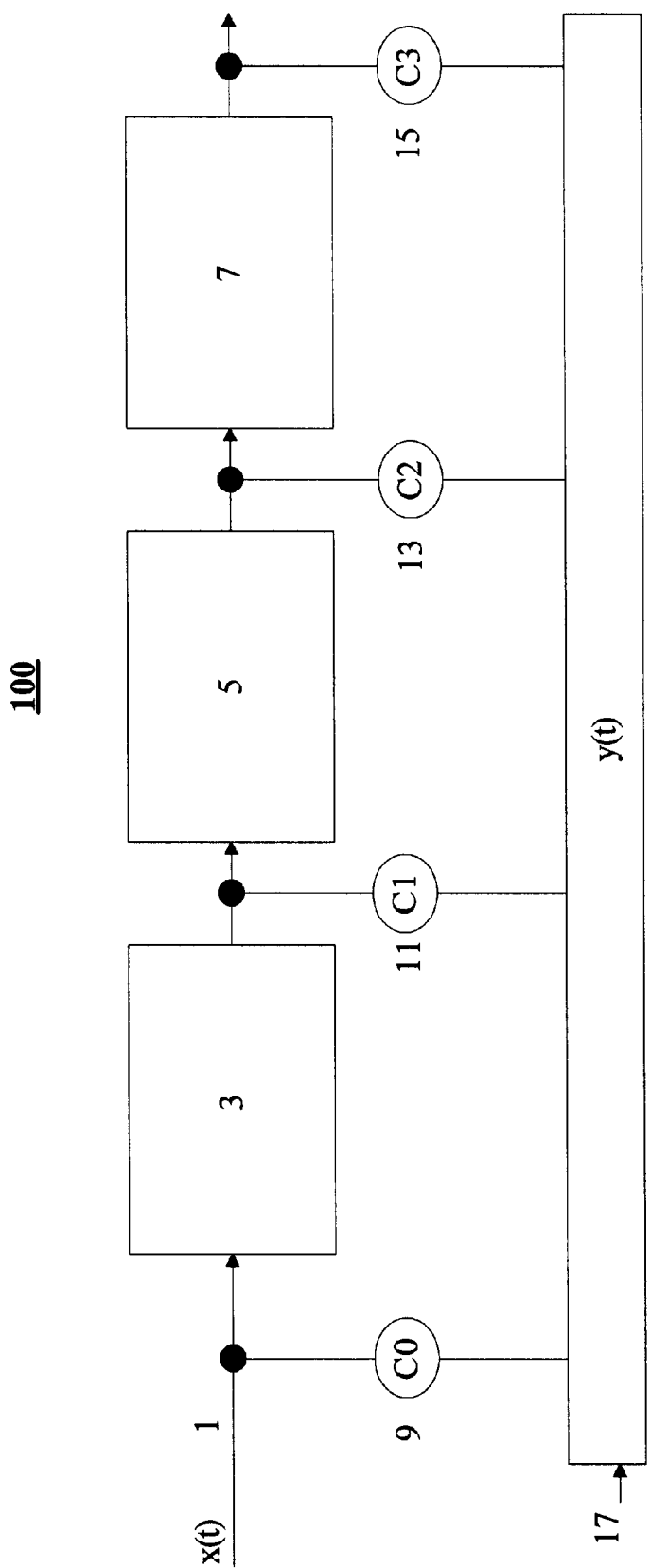
FIG. 1 illustrates a circuit schematic of a prior art tapped delay line analog filter.
Figure 2:
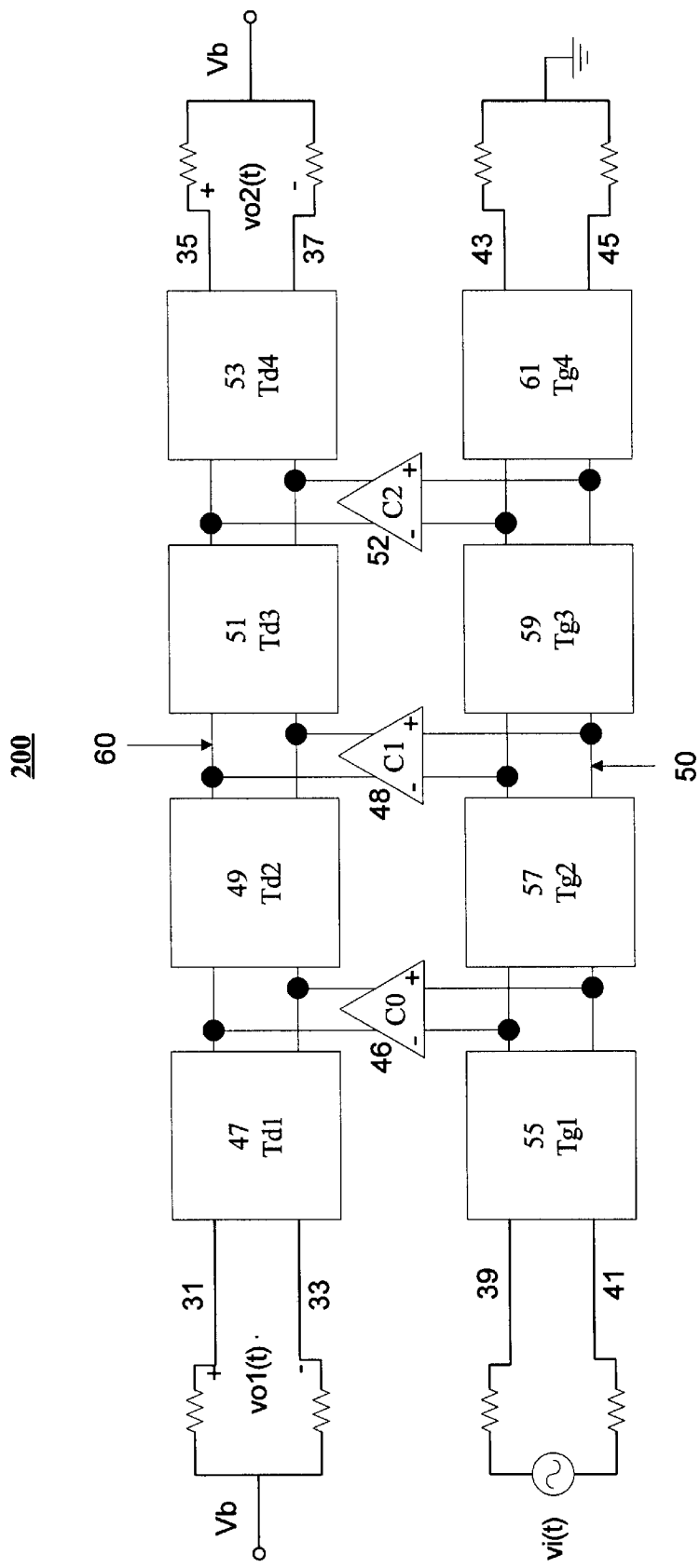
FIG. 2 illustrates one embodiment of the present invention wherein a tapped delay line filter employs differential delay cells.

FIG. 2 illustrates a circuit 200 in accordance with one embodiment of the present invention. Circuit 200 comprises: an input line denoted 50, comprising differential delay cells denoted 55, 57, 59, and 61; an output line denoted 60, comprising differential delay cells denoted 47, 49, 51, and 53; three gaincells or taps denoted 46, 48, and 52, each gaincell or tap comprises a tap weight denoted C0, C1, and C2 respectively; and two output signals vo1(t) and vo2(t).

As illustrated in FIG. 2, input line 50 terminates in impedances denoted 39, 41, 43, and 45; and output line 60 terminates in impedances denoted 31, 33, 35, and 37. Differential delay cells 55, 57, 59, and 61 are coupled in series along input line 50, and differential delay cells 47, 49, 51, and 53 are coupled in series along output line 60. Moreover, gaincells or taps 46, 48, and 52 are coupled between input line 50 and output line 60.

The gaincells or taps 46, 48, and 52 are differential amplifiers with programmable gain, whose output current is proportional to the input voltage; and the gaincells may be implemented with active devices such as bipolar junction transistors, Metal-Oxide-Semiconductor FETs, Heterojunction devices, etc.

Each of the gaincells or taps 46, 48, and 52 correspond to a tap weight or coefficient C0, C1, and C2 respectively. Moreover, each tap weight or coefficient may vary both in its sign and its value independently of any other tap weight or coefficient.

Figure 3:
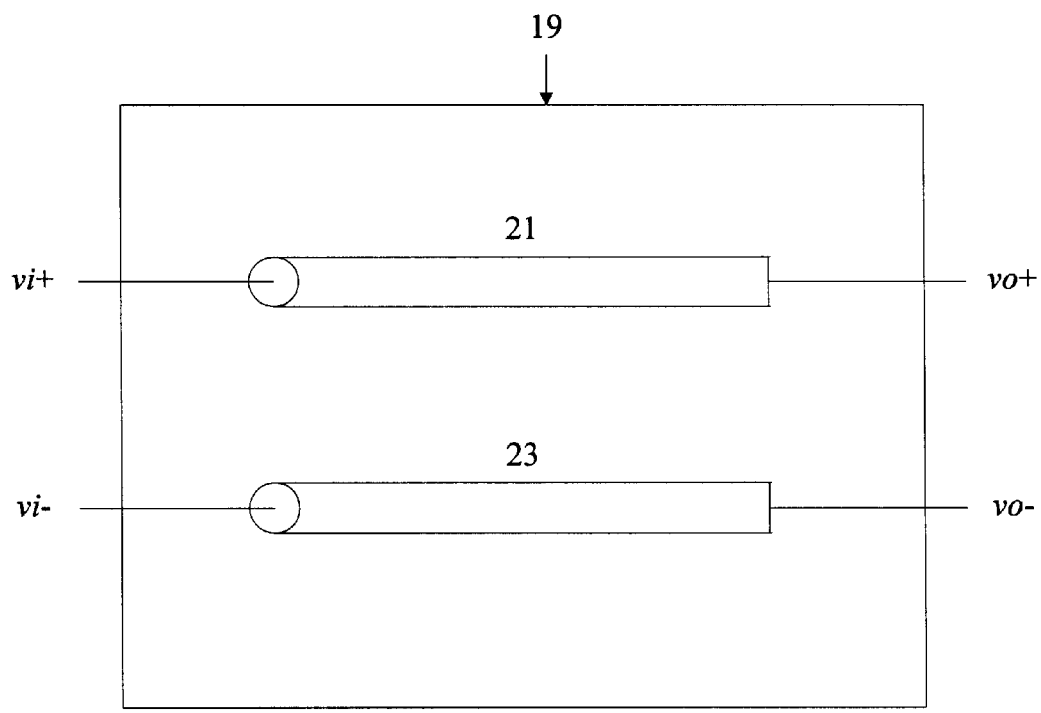
FIG. 3 illustrates two methods for implementing differential delay cells.
Figure 3:
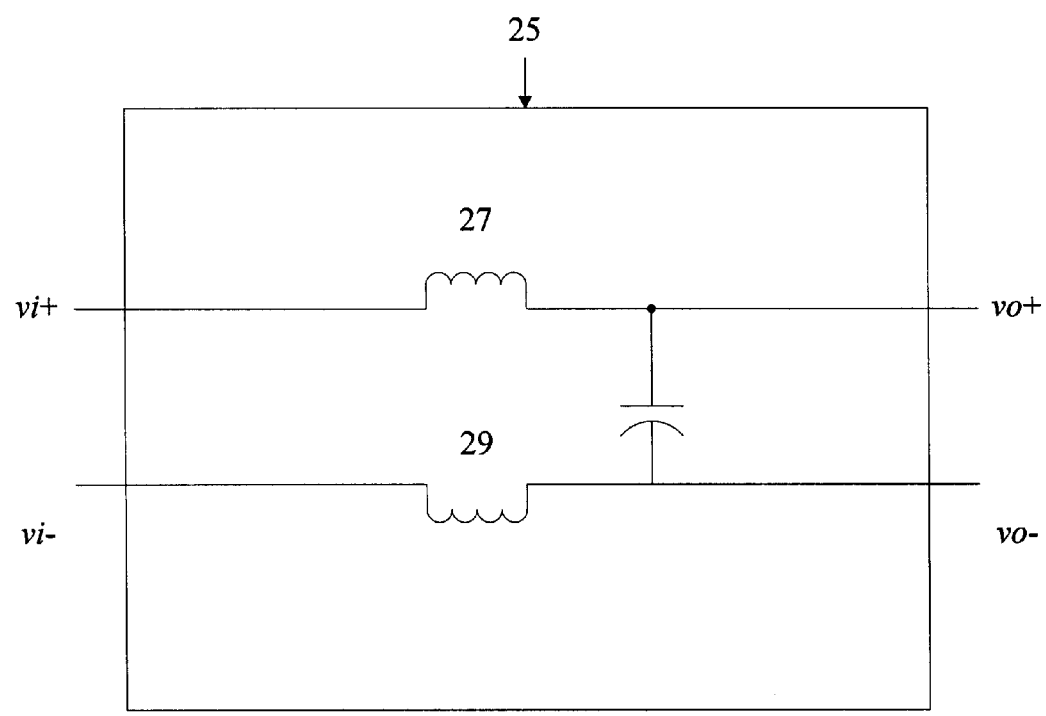

Differential delay cells 47, 49, 51, 53, 55, 57, 59, and 61 may be implemented with one of several methods. FIG. 3 illustrates two such implementations denoted 19 and 25. The first approach 19 for implementing a differential delay cell comprises transmission lines 21 and 23 that may be physical waveguides constructed from materials such as micro strips. In cases where the delays are large, the second approach 25 for implementing a differential delay cell may be employed where two inductors are coupled together with a capacitor. Moreover, each differential delay cell is characterized by:

$$vo_+(t)-vo_-(t)=vi_+(t-T)-vi_{31}(t-T)$$

where T represents delay period for each differential delay cell.

FIG. 2 further illustrates two output signals vo1(t) and vo2(t) at either end of output line 60. Furthermore, the output signals vo1(t), vo2(t), and the input signal vi(t) are characterized by the following equations:

$$vo1(t)=C0*vi(t-T1)+C1*vi(t-T2)+C2*vi(t-T3)$$

$$vo2(t)=C0*vi(t-T4)+C1*vi(t-T5)+C2*vi(t-T6)$$

where the variables T1, T2, T3, T4, T5, and T6 are represented by:

$$T1=Tg1+Td1$$

$$T2=Tg1+Td1+Tg2+Td2$$

$$T3=Tg1+Td1+Tg2+Td2+Tg3+Td3$$

$$T4=Tg1+Td2+Td3+Td4$$

$$T5=Tg1+Tg2+Td3+Td4$$

$$T6=Tg1+Tg2+Tg3+Td4$$

where Tg1, Tg2, Tg3, and Tg4 are delay periods for the four input differential delay cells 55, 57, 59, and 61 respectively; and Td1, Td2, Td3, and Td4 are delay periods for the four output differential delay cells 47, 49, 51, and 53 respectively.

Figure 4:
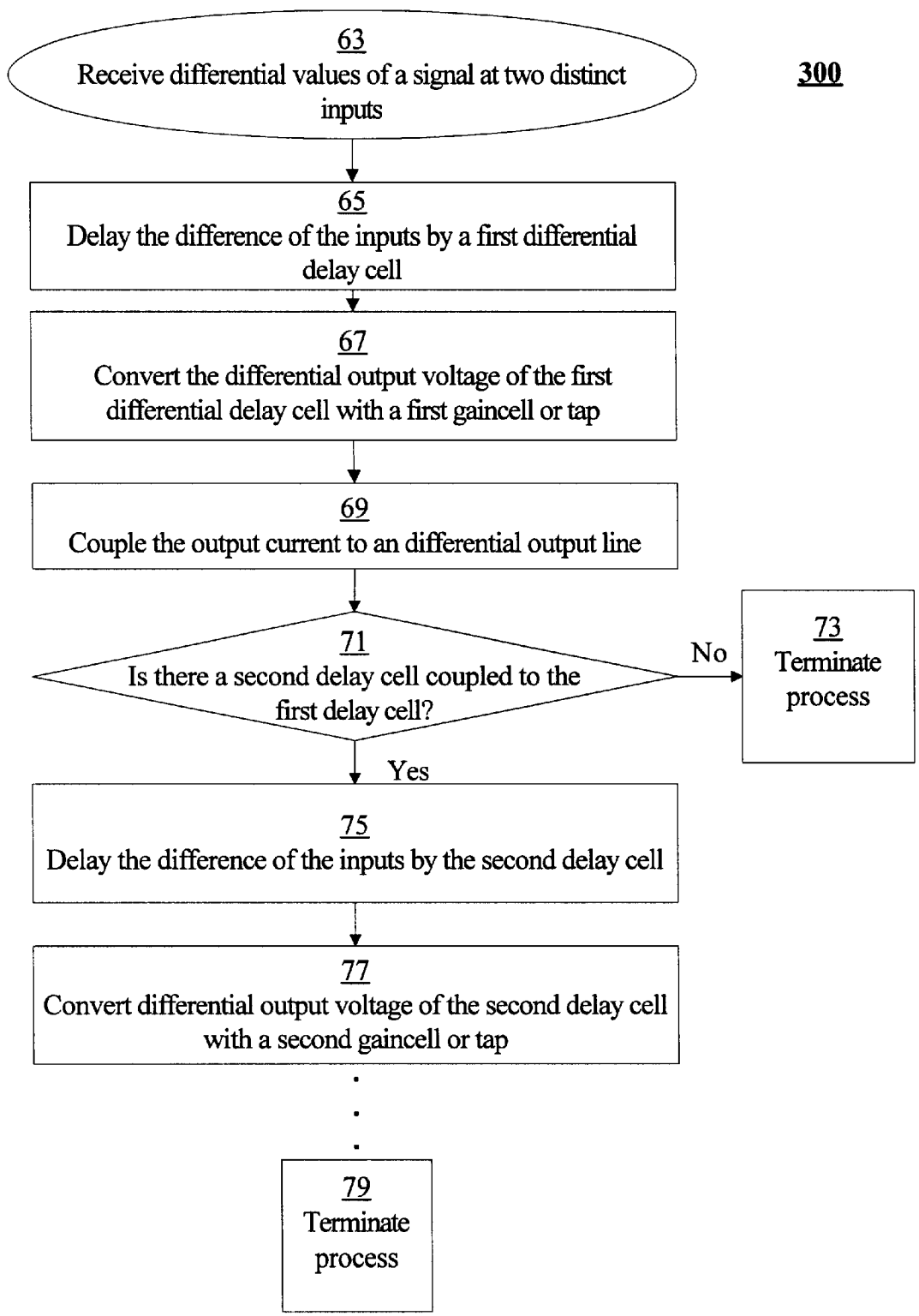
FIG. 4 illustrates a flow diagram for the steps of one embodiment of the present invention.

Referring now to FIG. 4, a flow diagram 300 is shown in accordance with the present invention.

In step 63, a programmable analog tapped delay line filter receives differential values of an input signal at two distinct inputs. Referring now to FIG. 4 in light of FIG. 2, the tapped delay line filter 200 receives an input signal vi(t) at the inputs 39 and 41.

In steps 65 and 67, the difference of the inputs is delayed by a first differential delay cell, and the differential output voltage from the first differential delay cell is converted with a first gaincell or tap to produce a differential output current. Moreover, the differential output current from the first gaincell or tap is proportional to a corresponding first tap weight.

Referring now to FIG. 4 in light of FIG. 2, the difference of inputs 39 and 41 is delayed with a first differential delay cell 55, and the resulting differential output voltage from the first differential delay cell is converted with a first gaincell or tap 46. Furthermore, the first gaincell or tap 46 in FIG. 2 produces a differential current proportional to a first tap weight C0.

In step 69, the output differential current is coupled to a differential output line. Referring now to FIG. 4 in light of FIG. 2, the output differential current is coupled to a differential output line 60.

Step 71 in FIG. 4 determines if there is another cascaded differential delay cell connected to the first differential delay cell. If no such cascaded differential delay cell exists, the entire delay process terminates in step 73. Otherwise, the delay process illustrated by steps 65, 67, and 69 is repeated for each of the additional cascaded differential delay cells as shown in steps 75 and 77.

When the differential value of the input signal has been delayed in each differential delay cell of one or more cascaded differential delay cells, the entire delay process terminates in step 79.

Although the invention has been described in connection with several embodiments, it is understood that this invention is not limited to the embodiments disclosed, but is capable of various modifications that would be apparent to a person skilled in the art.

For example, the one or more gaincells or taps in FIG. 2 may be implemented with a variety of active devices such as bipolar junction transistors, Metal-Oxide-Semiconductor FETs, Heterojunction devices, etc., and the one or more differential delay cells shown in FIG.2 may be implemented with transmission lines or L-C sections; without departing from the spirits of the present invention.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the arts to best utilize the invention and various embodiments with various modifications as are suited to the particular use contemplated. It is intended that the scope of the invention be defined by the Claims appended hereto and their equivalents.

We claim:

1. A programmable analog tapped delay line filter comprising:
   an input line comprising a first group of one or more cascaded differential delay cells, wherein the input line is terminated in impedances;
   an output line comprising a second group of one or more cascaded differential delay cells; and
   one or more gaincells or taps coupled between the input line and the output line.

2. The programmable analog tapped delay line filter of claim 1, wherein the output line is terminated in impedances.

3. The programmable analog tapped delay line filter of claim 1, wherein the first group and the second group of one or more cascaded differential delay cells are implemented with transmission lines.

4. The programmable analog tapped delay line filter of claim 1, wherein the first group and the second group of one or more cascaded differential delay cells are implemented with L-C sections.

5. The programmable analog tapped delay line filter of claim 1, wherein each of the one or more gaincells or taps has a corresponding tap weight or coefficient.

6. The programmable analog tapped delay line filter of claim 5, wherein each tap weight or coefficient may vary in sign or value independent of any other tap weight or coefficient.

7. The programmable analog tapped delay line filter of claim 1, wherein the one or more gaincells or taps are implemented with differential amplifiers with programmable gain.

8. A method for compensating for interference using a programmable analog tapped delay line filter, comprising:
   receiving differential values of an input signal at two distinct inputs of a differential input line;

delaying the difference of the two distinct inputs by a first differential delay cell, wherein there exists one or more cascaded differential delay cells coupled to the first differential delay cell;

producing a first differential output voltage at the first differential delay cell;

converting the first differential output voltage with a first gaincell or tap to a first differential output current; and coupling the first differential output current to a differential output line.

9. The method of claim 8, wherein there exists no other cascaded differential delay cell.

10. The method of claim 9, wherein the process terminates and outputs one or more output signals.

11. The method of claim 8, wherein the delaying step, comprising: after determining that one or more cascaded differential delay cells are coupled to the first differential delay cell, repeating the delay process for the difference of the two distinct inputs with each of the one or more cascaded differential delay cells coupled to the first differential delay cell.

12. The method of claim 8, wherein the first gaincell or tap outputs a first output differential current proportional to a first tap weight or coefficient corresponding to the first gaincell or tap.

13. A programmable analog tapped delay line filter comprising:

an input line comprising a first group of one or more cascaded differential delay cells;

an output line comprising a second group of one or more cascaded differential delay cells, wherein the output line is terminated in impedances; and one or more gaincells or taps coupled between the input line and the output line.

14. The programmable analog tapped delay line filter of claim 13, wherein the input line is terminated in impedances.

15. The programmable analog tapped delay line filter of claim 13, wherein each of the one or more gaincells or taps has a corresponding tap weight or coefficient.

16. A programmable analog tapped delay line filter comprising:

an input line comprising a first group of one or more cascaded differential delay cells;

an output line comprising a second group of one or more cascaded differential delay cells; and one or more gaincells or taps coupled between the input line and the output line, wherein each of the one or more gaincells or taps has a corresponding tap weight or coefficient, wherein each tap weight or coefficient may vary in sign or value independent of any other tap weight or coefficient.

17. A method for compensating for interference using a programmable analog tapped delay line filter, comprising:

receiving differential values of an input signal at two distinct inputs of a differential input line;

delaying the difference of the two distinct inputs by a first differential delay cell;

producing a first differential output voltage at the first differential delay cell;

converting the first differential output voltage with a first gaincell or tap to a first differential output current, wherein the first gaincell or tap outputs a first output differential current proportional to a first tap weight or coefficient corresponding to the first gaincell or tap; and coupling the first differential output current to a differential output line.

18. The method of claim 17, wherein there exists one or more cascaded differential delay cells coupled to the first differential delay cell.

* * * * *